US006285700B1

(12) United States Patent
Ueno et al.

(10) Patent No.: US 6,285,700 B1
(45) Date of Patent: Sep. 4, 2001

(54) SEMICONDUCTOR LASER

(75) Inventors: Yoshiyasu Ueno; Hiroaki Chida, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/212,473

(22) Filed: Dec. 16, 1998

(30) Foreign Application Priority Data

Dec. 18, 1997 (JP) .................................................... 9/349319
May 12, 1998 (JP) .................................................. 10/129076

(51) Int. Cl.[7] ........................................................ H10S 5/00
(52) U.S. Cl. .................................. 372/49; 372/49; 372/42
(58) Field of Search ........................................ 372/49, 42

(56) References Cited

U.S. PATENT DOCUMENTS 4,464,762 * 8/1984 Furuya ..................................... 372/50
4,993,036 * 2/1991 Ikeda et al. ............................. 372/50
5,383,214 * 1/1995 Kidoguchi et al. ..................... 372/46

FOREIGN PATENT DOCUMENTS 5-37085    2/1993 (JP) .
8-307004  11/1996 (JP) .
9-260777  10/1997 (JP) .

* cited by examiner

*Primary Examiner*—Frank G. Font
*Assistant Examiner*—Delma R. Flores Ruiz
(74) *Attorney, Agent, or Firm*—Sughrue, Mion, Zinn, Macpeak & Seas, PLC

(57) ABSTRACT

A semiconductor laser capable of producing a high optical output has a coating film applied to an exit end. The coating film has a refractive index ($n_1$) which is large compared with the refractive index ($n_{eff}$) of a semiconductor waveguide. The refractive index ($n_1$) and the refractive index ($n_{eff}$) satisfy the relationship: $n_1^2 > n_{eff}$.

4 Claims, 7 Drawing Sheets

SEMICONDUCTOR LASER

BACKGROUND OF THE INVENTION

1. Field of the Invention

The present invention relates to a high-output semiconductor laser for use in optical disk drives and optical communication devices, and a method of manufacturing such a high-output semiconductor laser.

2. Description of the Related Art

When the optical output of a semiconductor laser reaches a certain level, the exit end of the semiconductor laser suffers catastrophic optical damage (COD). Therefore, the optical output of the semiconductor laser is limited below a certain value (COD optical output). The COD occurs when the optical density in the semiconductor reaches an inherent value (COD optical density) of the semiconductor.

One way of increasing the COD optical output of a semiconductor laser is to coat the exit end thereof with a film such as of a dielectric material. When such a coating is applied to the exit end to lower the reflectivity of the exit end, the optical density in the semiconductor waveguide is lowered thereby to increase the COD optical output. As Hakki and Nash reported in Journal of Applied Physics, Vol. 45, No. 9, pages 3907–3912, 1974, the exit end reflectivity $R_1$ and the COD optical output are related to each other according to the following equation (1):

$$\frac{P_{coated}}{P_{uncoated}} = n_{\mathit{eff}} \frac{1-R_1}{\left(1+\sqrt{R_1}\right)^2} \qquad \text{equation 1}$$

(the equation (4) in the above literature) where $P_{coated}$: the COD optical output of a laser having an exit end coating with a reflectivity $R_1$;

$P_{uncoated}$: the COD optical output of a laser having no exit end coating $R_1$: the exit end reflectivity; and $n_{\mathit{eff}}$: the effective refractive index of the semiconductor waveguide.

After the report by Hakki and Nash, the above equation has been used so far in designing high-output semiconductor lasers. The left side of the above equation (1):

$$\frac{P_{coated}}{P_{uncoated}}$$

will be referred to as a COD index.

According to the equation by Hakki and Nash, the only way to increase the COD index is reducing the reflectivity. Under limit conditions where the reflectivity is infinitely small, the COD index converges to a maximum value $n_{\mathit{eff}}$. Therefore, it is impossible to increase the COD index beyond $n_{\mathit{eff}}$. However, if the reflectivity $R_1$ is reduced, an oscillation threshold carrier density increases, degrading the oscillation characteristics of the semiconductor laser, e.g., resulting in an increased oscillation threshold current and degraded temperature characteristics.

Japanese laid-open patent publication No. 8-307004 discloses the relationship between the refractive index of a coating film of a semiconductor laser and the optical density in the semiconductor. FIG. 6 of this publication shows that if the refractive index of the coating film is greater than a certain value, the reflectivity increases and the optical density in the semiconductor decreases. The thickness ($d_1^A$) of the coating film, the refractive index ($n_1^A$) thereof, and the laser beam wavelength ($\lambda$) fulfill the following equation:

$$d_1^A = \frac{\lambda}{4 n_1^A}$$

For example, if the refractive index is 1.3, then the reflectivity is 0.10, and the optical density ($|E_A|^2$) in the semiconductor is 0.6. If the refractive index is 2.5, then the reflectivity is 0.10, but the optical density ($|E_A|^2$) in the semiconductor has a smaller value of 0.2. Thus, the results disclosed in the above publication are obviously different from the results produced by Hakki and Nash.

The above publication describes operation and embodiments of a coating film comprising at least two dielectric films. According to the publication, the problems to be solved are that LDs of the Fabry-Perot design where an end film comprises a single dielectric film is generally unable to satisfy both a condition to obtain the reflectivity of the LD exit end which is required from the standpoint of designing LDs and a condition to minimize the photoelectric intensity at the interface between a semiconductor material and the end film which is required to avoid COD. However, the publication is silent as to whether the minimum value of the photoelectric intensity by a coating film composed of two dielectric films according to the embodiment is smaller than the minimum value of the photoelectric intensity by a single dielectric film.

Japanese laid-open patent publication No. 8-307004 suggests that a coating film comprising a single film may exhibit a COD index greater than the equation by Hakki and Nash. However, any optimum conditions between the coating film thickness and the refractive index are not revealed, and no comparison with the report by Hakki and Nash is disclosed.

As described above, any optimum conditions for the coating of the dielectric film relative to the COD optical output of semiconductor lasers are not clear, and it is difficult optimize semiconductor lasers to be designed.

SUMMARY OF THE INVENTION

It is therefore an object of the present invention to provide a semiconductor laser having output characteristics improved by clarifying conditions for the coating of a dielectric film relative to the COD optical output of the semiconductor laser and effects which such a dielectric film has on the optical density in the semiconductor.

Another object of the present invention to provide a method of manufacturing such a semiconductor laser.

According to an aspect of the present invention, there is provided a method of manufacturing a semiconductor laser having a coating film composed of a single layer or a plurality of layers, on an exit end of a semiconductor laser waveguide, comprising the step of:

selecting a refractive index $n_1$ of at least one layer of said coating film to fall within a range of ±20% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end.

According to another aspect of the present invention, there is provided a method of manufacturing a semiconductor laser having a coating film composed of a single layer or a plurality of layers, on an exit end of a semiconductor laser waveguide, comprising the step of:

selecting a refractive index $n_1$ of at least one layer of said coating film to fall within a range of ±10% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end.

According to still another aspect of the present invention, there is provided a method of manufacturing a semiconductor laser having a coating film composed of a single layer or a plurality of layers, on an exit end of a semiconductor laser waveguide, comprising the steps of:

selecting a refractive index $n_1$ of at least one layer of said coating film to fall within a range of ±20% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end; and selecting a thickness of a layer other than said layer having the refractive index $n_1$ according to:

$$\frac{\lambda}{2n_j}$$

where $n_j$ represents the refractive index of the other layer and $\lambda$ the oscillation wavelength of the semiconductor laser.

According to yet still another aspect of the present invention, there is provided a method of manufacturing a semiconductor laser having a coating film composed of a single layer or a plurality of layers, on an exit end of a semiconductor laser waveguide, comprising the steps of:

selecting a refractive index $n_1$ of at least one layer of said coating film to fall within a range of ±10% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end; and selecting a thickness of a layer other than said layer having the refractive index $n_1$ according to:

$$\frac{\lambda}{2n_j}$$

where $n_j$ represents the refractive index of the other layer and $\lambda$ the oscillation wavelength of the semiconductor laser.

According to a further aspect of the present invention, there is provided a semiconductor laser having a coating film composed of a single layer or a plurality of layers, on an exit end of a semiconductor laser waveguide, said coating film having at least one layer having a refractive index $n_1$ which falls within a range of ±20% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end.

According to a still further aspect of the present invention, there is provided a semiconductor laser having a coating film composed of a single layer or a plurality of layers, on an exit end of a semiconductor laser waveguide, said coating film having at least one layer having a refractive index $n_1$ which falls within a range of ±10% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end.

According to a yet further aspect of the present invention, there is provided a semiconductor laser having a coating film composed of a single layer or a plurality of layers, on an exit end of a semiconductor laser waveguide, said coating film having at least one layer having a refractive index $n_1$ which falls within a range of ±20% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end, said coating film having a layer other than said layer having the refractive index $n_1$, the other layer having a thickness according to:

$$\frac{\lambda}{2n_j}$$

where $n_j$ represents the refractive index of the other layer and $\lambda$ the oscillation wavelength of the semiconductor laser.

According to a yet still further aspect of the present invention, there is provided a semiconductor laser having a coating film composed of a single layer or a plurality of layers, on an exit end of a semiconductor laser waveguide, said coating film having at least one layer having a refractive index $n_1$ which falls within a range of ±10% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end, said coating film having a layer other than said layer having the refractive index $n_1$, the other layer having a thickness according to:

$$\frac{\lambda}{2n_j}$$

where $n_j$ represents the refractive index of the other layer and $\lambda$ the oscillation wavelength of the semiconductor laser.

Reasons why the COD optical output increases beyond the level represented by the equation (1) by applying a high-reflectivity coating film to a semiconductor laser will be described below. The coating film according to the present invention does not fulfill the equation (1).

A process of deriving the relationship between an applied photoelectric field and a reflected photoelectric field at a coating film on the exit end of a general semiconductor laser will be described below with reference to FIG. 1 of the accompanying drawings.

In FIG. 1, the coating film is a dielectric composite film comprising two layers which include a dielectric layer 1 having a refractive index $n_1$ and a thickness $dx_1$ and a dielectric layer 2 having a refractive index $n_2$ and a thickness $dx_2$. The dielectric composite film may alternatively comprise more layers.

With the phase of light being taken into account as reported in Journal of laser research, Vol. 18, No. 3, pages 38–46, 1990, a photoelectric field ($E_1^R$) applied from within the semiconductor laser to the multi-layer coating film, a photoelectric field ($E_1^L$) reflected by an interface of the coating film, and a photoelectric field transmitted out of the coating film, i.e., an output photoelectric field ($E_3^R$), are related to each other as follows:

$$\begin{pmatrix} E_1^R \\ E_1^L \end{pmatrix} = \begin{pmatrix} s_{11} & s_{12} \\ s_{21} & s_{22} \end{pmatrix} \begin{pmatrix} E_3^R \\ 0 \end{pmatrix} \qquad \text{equation 2}$$

$$S = \begin{pmatrix} s_{11} & s_{12} \\ s_{21} & s_{22} \end{pmatrix} \qquad \text{equation 3}$$

$$s = B_0^{-1} \times \prod_{l=1}^{m} U_l \times B_{m+1} \qquad \text{equation 4}$$

$$B_i = \begin{pmatrix} 1 & 1 \\ n_1 & -n_1 \end{pmatrix} \qquad \text{equation 5}$$

$$U_l = B_l \times M_l^{-1} \times B_l^{-1} \qquad \text{equation 6}$$

$$M_l = \begin{pmatrix} \beta_l & 0 \\ 0 & \frac{1}{\beta_l} \end{pmatrix} \qquad \text{equation 7}$$

$$\beta_l = \exp(-i \times \phi_l) \qquad \text{equation 8}$$

$$\phi_l = k_l \times dx_l \qquad \text{equation 9}$$

$$k_l = \frac{2\pi \times n_l}{\lambda} \qquad \text{equation 10}$$

where m represents the number of layers of the coating film. $dx_1$, $n_1$ (l=1, 2, ..., m) represent the thickness and refractive index of an lth coating film layer as counted from the interface between the semiconductor and the coating film. The effective refractive index of the semiconductor waveguide is represented by $n_0$, and the refractive index of a gas (air of a sealed gas) around the semiconductor laser is represented by $n_{m+1}$. The wavelength of an oscillated laser beam is represented by $\lambda$. The optical intensity ($P_{t0}$) inward of the interface between the semiconductor waveguide and the coating film and the optical intensity ($P_{t1}$) of the output beam passing through the coating film are expressed as follows:

$$P_{t0} = n_{eff} \times |E_1^R + E_1^L|^2 \qquad \text{equation 11}$$

$$P_{t1} = |E_3^R|^2 \qquad \text{equation 12}$$

The effective refractive index $n_0$ is replaced with the effective refractive index $n_{eff}$ within the semiconductor laser and the refractive index $n_{m+1}$ of the external gas is set to 1. Using the equation (2), the ratio of the equations (11), (12) is determined as follows:

$$\frac{P_{t1}}{P_{t0}} = \frac{|E_3^R|^2}{n_{eff} \times |E_1^R + E_1^L|^2} = \frac{1}{n_{eff}} \times \left| \frac{1}{s_{21} + s_{11}} \right|^2 \qquad \text{equation 13}$$

For an uncoated semiconductor laser, this ratio is represented by:

$$\frac{P_{t1}^{uncoating}}{P_{t0}} = \frac{1}{n_{eff}} \qquad \text{equation 14}$$

Both a coated semiconductor laser and an uncoated semiconductor laser suffer COD when the internal optical intensity ($P_{t0}$) reaches a certain COD optical density. Therefore, the COD index is equal to the ratio of:

$$\frac{P_{t1}}{P_{t0}} \text{ and } \frac{P_{t1}^{uncoated}}{P_{t0}}$$

Using the equation (13), (14), the following equation is obtained:

$$\frac{P_{coated}}{P_{uncoated}} = \left| \frac{1}{s_{21} + s_{11}} \right|^2 \qquad \text{equation 15}$$

The exit end reflectivity $R_1$ is given by:

$$R_1 = \left| \frac{E_{1L}}{E_{1R}} \right|^2 = \left| \frac{s_{21}}{s_{11}} \right|^2 \qquad \text{equation 16}$$

The differences between the features of the present invention and those of the equation (1) by Hakki and Nash will be described. For the sake of brevity, it is assumed that the coating film on the exit end comprises a single layer, and also the thickness of the coating film satisfies the following relationship:

$$dx_1 = \frac{\lambda}{4n_1}$$

From the equations (15), (16), a COD index and a reflectivity are determined as follows:

$$\frac{P_{coated}}{P_{uncoated}} = n_1^2 \qquad \text{equation 17}$$

$$R_1 = \left| \frac{n_1^2 - n_{eff}}{n_1^2 + n_{eff}} \right|^2 \qquad \text{equation 18}$$

Using the equations (17), (18), the relationship between:

$$\frac{P_{coated}}{P_{uncoated}}$$

and the exit end reflectivity $R_1$ is determined. It can be seen from the determined relationship that the result when $n_1^2 > n_{eff}$ is different from the result when $n_1^2 < n_{eff}$. When $n_1^2 < n_{eff}$, the following equation is satisfied:

$$\frac{P_{coated}}{P_{uncoated}} = n_{eff} \times \frac{1 - R_1}{\left(1 + \sqrt{R_1}\right)^2} \qquad \text{equation 19}$$

When $n_1^2 > n_{eff}$, the following equation is satisfied:

$$\frac{P_{coated}}{P_{uncoated}} = n_{eff} \times \frac{1 - R_1}{\left(1 - \sqrt{R_1}\right)^2} \qquad \text{equation 20}$$

This difference is due to the phase relationship between the applied photoelectric field ($E_1^R$) and the reflected photoelectric field ($E_1^L$). The equation (2) is solved, and the reflected photoelectric field ($E_1^L$) is expressed by the applied photoelectric field ($E_1^R$) as follows:

$$E_1^L = \frac{n_{eff} - n_1^2}{n_1^2 + n_{eff}} \qquad \text{equation 21}$$

If the coating film has a small refractive index ($n_1^2 < n_{eff}$), the sign of the right side of the equation (21) is positive. That is, the reflected light is in phase with the applied light. Therefore, when the applied light and the reflected light interfere with each other in the interface between the semiconductor and the coating film, the applied light and the reflected light are superposed on each other (constructive interference). At this time, the equation (19) of the COD index is completely in accord with the equation (1) by Hakki and Nash. Actually, since the coating film of the laser studied by Hakki and Nash using the equation (1) was made of SiO and had a refractive index of 1.9 (Ettenberg, et al., Applied Physics Letters, Vol. 18, No. 12 pages 571–573, 1971), the relationship $n_1^2 < n_{eff}$ was satisfied. Though Hakki and Nash did not explicitly describe in their article, they made their analysis only under the condition: $n_1^2 < n_{eff}$.

Conversely, if the coating film has a large refractive index ($n_1^2 > n_{eff}$), the sign of the right side of the equation (21) is negative. That is, the phase of the reflected light is opposite to the phase of the applied light. Therefore, when the applied light and the reflected light interfere with each other in the interface between the semiconductor and the coating film, the applied light and the reflected light cancel each other (destructive interference).

It is important to note that the right side of the equation (20) is always greater than the right side of the equation (19). This is because the photoelectric fields cancel each other in the semiconductor, lowering the internal optical density. Consequently, the COD index of a semiconductor laser whose exit end is coated with a coating film that satisfies the condition: $n_1^2 > n_{eff}$ is greater than that of the semiconductor laser of the conventional design which has the same exit end reflectivity $R_1$ and whose exit end is coated with a coating film that satisfies the condition: $n_1^2 < n_{eff}$. These are basic features of the present invention.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
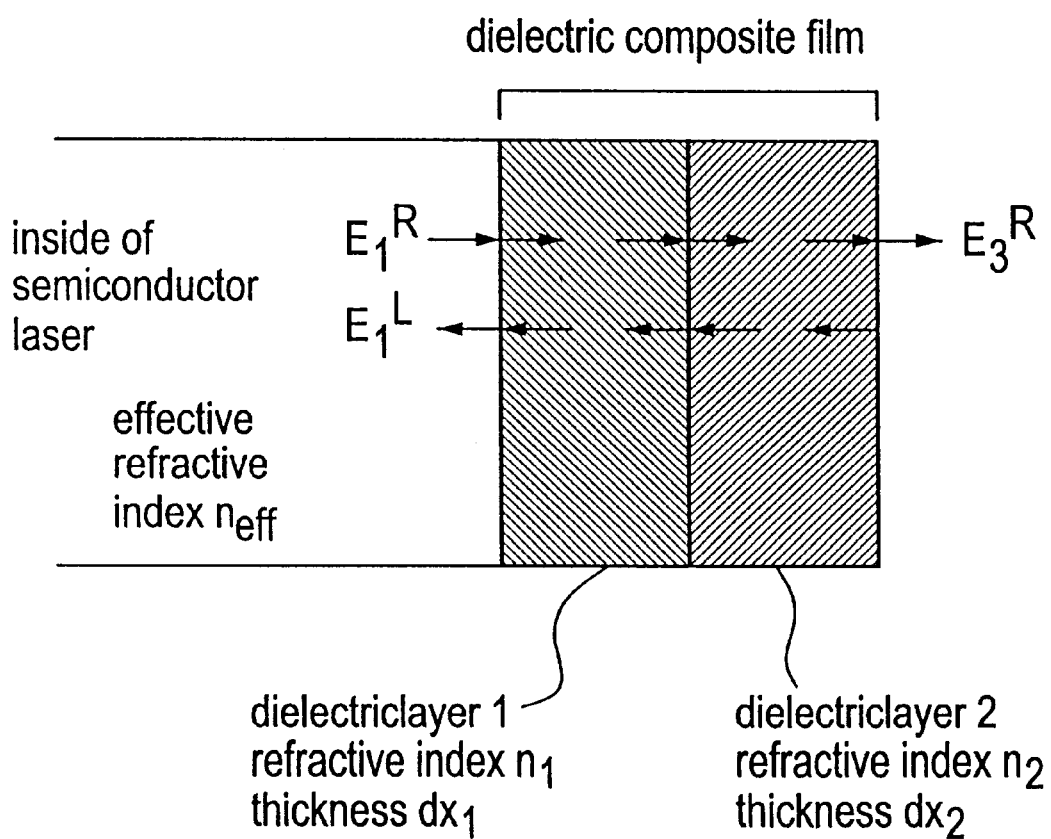
FIG. 1 is a schematic view illustrative of the manner in which a semiconductor laser according to the present invention operates.
Figure 2A:
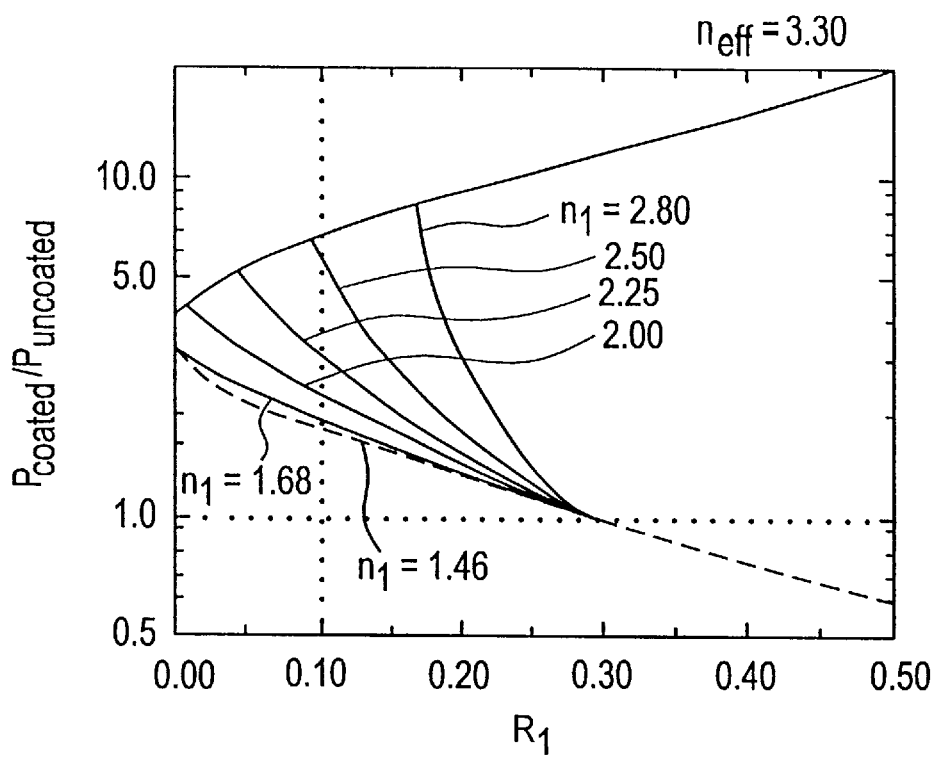
FIG. 2(A) is a diagram showing effects of an exit end coating according to the present invention.

FIG. 2(A) shows the relationship between the COD index $P_{coated}/P_{uncoated}$ and the exit end reflectivity $R_1$ of a semiconductor laser whose exit end is coated with a high-refractive index film.

The COD index $P_{coated}/P_{uncoated}$ was calculated according to the above equations (15), (16). The calculations were carried out with respect to six different coating films having respective refractive indexes of 2.80, 2.50, 2.25, 2.00, 1.68, and 1.46, each of the six different coating films comprising a single layer. The film thickness satisfied the condition:

$$0 \leq dx_1 \leq \frac{\lambda}{2n_1}$$

and the effective refractive index ($n_{eff}$) of the semiconductor waveguide was 3.30. Therefore, the coating films having respective refractive indexes $n_1$=2.80, 2.50, 2.25, and 2.00 satisfy $n_1^2 > n_{eff}$. For example, if the coating film has a refractive index of 2.50, then the reflectivity decreases and the COD index $P_{coated}/P_{uncoated}$ increases as the film thickness increases. When $$dx_1 = \frac{\lambda}{4n_1}$$

the COD index $P_{coated}/P_{uncoated}$ reaches its maximum value. From the equation (17), the maximum value of the COD index $P_{coated}/P_{uncoated}$ is $n_1^2=6.2$. At this time, the exit end reflectivity $R_1$ is 0.095 according to the equation (18). As the film thickness increases further, the relationship between the COD index $P_{coated}/P_{uncoated}$ and the exit end reflectivity $R_1$ returns along the original curve, and when $$dx_1 = \frac{\lambda}{2n_1}$$

their values become $R_1=0.3$ and $P_{coated}/P_{uncoated}=1.0$, i.e., values of a semiconductor laser with no end coating film.

Figure 2B:
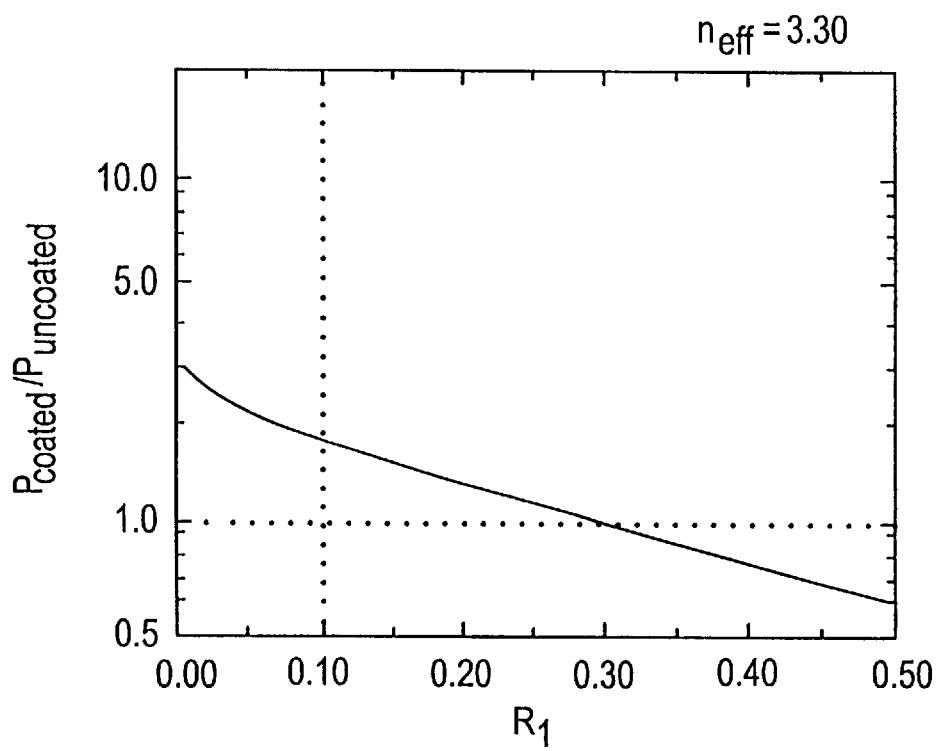
FIG. 2(B) is a diagram showing effects of a conventions exit end coating as a comparative example.

FIG. 2(A) indicates that the COD index for the coating films which satisfy $n_1^2>n_{eff}$ ($n_1=2.80$, 2.50, 2.25, and 2.00) is much higher than the COD index for the coating films which do not satisfy $n_1^2>n_{eff}$ ($n_1=1.68$, 1.46). The broken-line curve in FIG. 2(A) is a curve represented by the equation (20), which indicates an upper limit for the COD index. For comparison, FIG. 2(B) shows the relationship represented by the equation (1) by Hakki and Nash. As described above, the equation (1) by Hakki and Nash is in full agreement with the equation (19). In FIG. 2(A), the equation (1) by Hakki and Nash gives a lower limit for the COD index as indicated by the broken-line curve.

As can be seen from FIG. 2(A), there exists an optimum coating film refractive index $n_1$ for giving a greatest COD index with respect to each reflectivity $R_1$. The optimum coating film refractive index $n_1$ is expressed by:

$$n_1 = \sqrt{n_{eff} \times \frac{1-R_1}{\left(1-\sqrt{R_1}\right)^2}} \quad \text{equation 22}$$

which is derived from the equations (17), (20). For example, if $n_{eff}=3.30$, then the optimum refractive index $n_1$ is 2.33 when $R_1=6\%$, 2.52 when $R_1=10\%$, and 2.94 when $R_1=20\%$. When the film thickness is given, using an optimum coating film, by:

$$\frac{\lambda}{4n_1}$$

the maximum COD index ($=n_1^2$) is obtained.

For increasing the optical output of a semiconductor laser, it is desirable to lower the exit end reflectivity thereof. While the ideal coating film refractive index $n_1$ is expressed by the above equation (22), it can be understood from FIG. 2(A) that there can be obtained a semiconductor laser having a sufficient COD index even if the coating film refractive index falls in a range across the ideal coating film refractive index $n_1$. If the coating film refractive index is lower than the ideal coating film refractive index, then the COD index $P_{coated}/P_{uncoated}$ decreases, but the exit end reflectivity is reduced for increased oscillation efficiency. If the coating film refractive index is higher than the ideal coating film refractive index, then the exit end reflectivity increases, but the COD index $P_{coated}/P_{uncoated}$ increases.

FIG. 2(A) shows an ideal coating film refractive index $n_1$ of 2.50, expressed by the equation (22), which is close to 2.52 when $R_1=10\%$. A review of other refractive indexes shown in FIG. 2(A) with respect to the ideal coating film refractive index $n_1$ of 2.50 indicates that a sufficient exit end reflectivity and COD index $P_{coated}/P_{uncoated}$ can be obtained by a coating film having a refractive index of 2.00, which is lower than the refractive index of 2.50 by 20%, a coating film having a refractive index of 2.25, which is lower than the refractive index of 2.50 by 10%, or a coating film having a refractive index of 2.80, which is higher than the refractive index of 2.50 by about 10%.

Therefore, the coating film refractive index $n_1$ according to the equation (22) is not limited to the ideal value, but may be in a range of ±20% of the ideal value, preferably, ±10% of the ideal value.

Figure 3A:
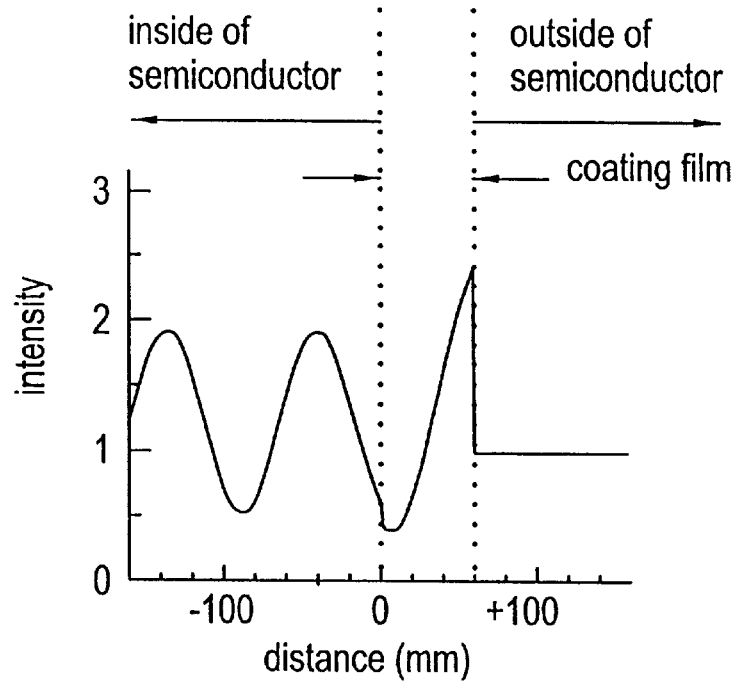
FIG. 3(A) is a diagram illustrative of the optical intensity distribution of a semiconductor laser according to the present invention.

If the exit end reflectivity of 10% is required, then the coating film (e.g., of TiON) whose $n_1=2.50$ is a nearly optimum film. If the film thickness is expressed by:

$$\frac{\lambda}{n_1} \times 0.227$$

which is slightly smaller than $$\frac{\lambda}{4n_1}$$

then a coating film with the reflectivity $R_1=10\%$ and the COD index=5.6 is obtained. FIG. 3(A) shows an optical intensity distribution ($\lambda=633$ nm) in the vicinity of the coating film thus obtained. Since incoming and outgoing waves cancel each other at the interface between the semiconductor and the coating film near the semiconductor, producing a standing wave node, the semiconductor laser is less subject to COD. The COD index in this case is of a value which is 3.0 times greater than the COD index of a semiconductor laser with a conventional $Al_2O_3$ coating:

$$\left(R_1 = 10\%, n_1 = 1.68 \text{ film thickness} = \frac{\lambda}{n_1} \times 0.163\right)$$

Figure 3B:
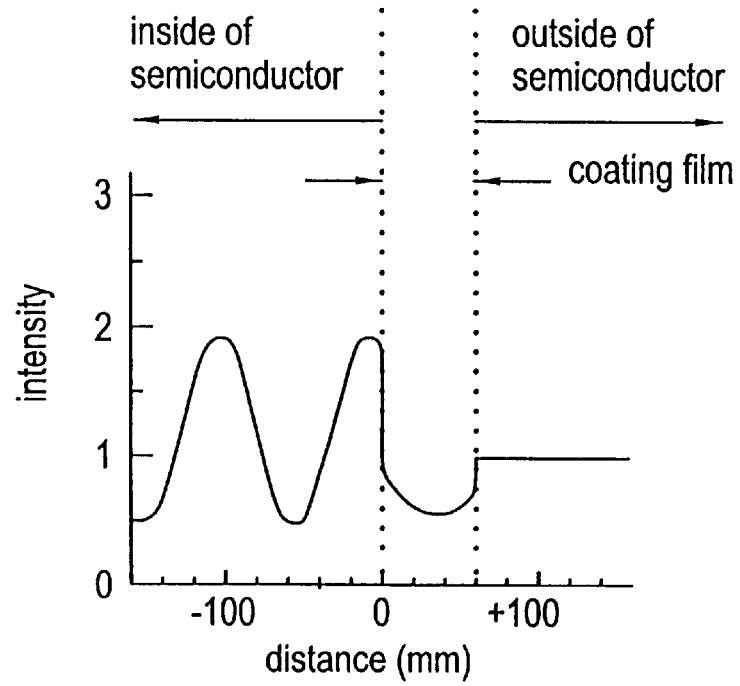
FIG. 3(B) is a diagram illustrative of the optical intensity distribution of a conventional semiconductor laser as a comparative example.

With the $Al_2O_3$ coating, a standing wave antinode is formed in the interface between the semiconductor and the coating film as shown in FIG. 3(B). In FIG. 3(B), the output optical density is plotted so as to be equal to the output optical density shown in FIG. 3(A).

Figure 4A:
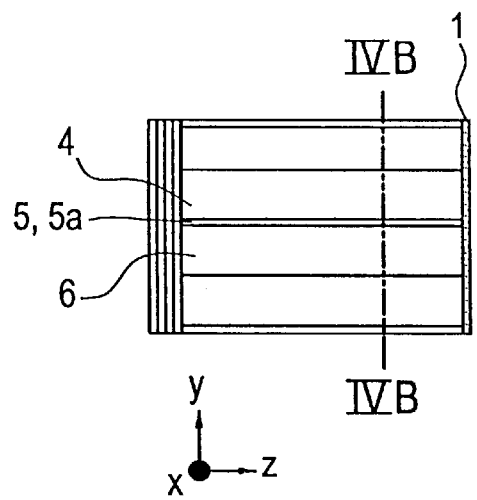
FIG. 4(A) is a cross-sectional view of an AlGaInP multiple quantum well laser according to an embodiment of the present invention.
Figure 4B:
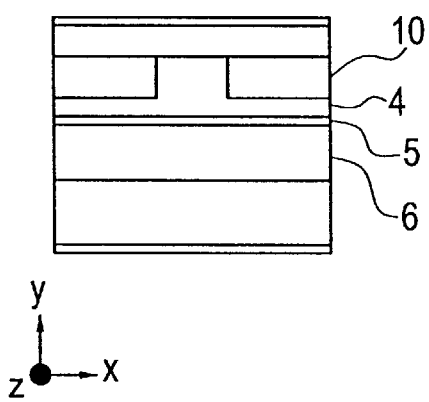
FIG. 4(B) is a cross-sectional view taken along line IV(B)—IV(B) of FIG. 4(A)
Figure 4C:
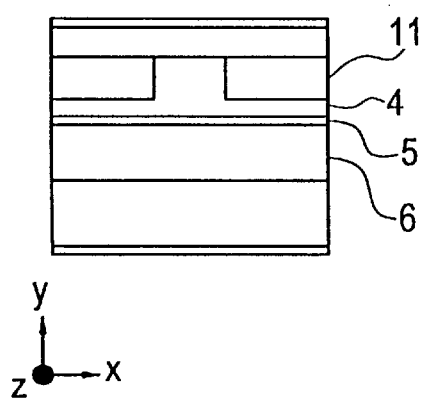
FIG. 4(C) is a view similar to FIG. 4(B), showing an AlGaInP multiple quantum well laser according to another embodiment of the present invention.

FIG. 4(A) shows in cross section an AlGaInP semiconductor laser according to the present invention. The semiconductor has a semiconductor double-heterojunction structure comprising a p-type $(Al_{0.7}Ga_{0.3})_{0.5}In_{0.5}P$ cladding layer 4, an AlGaInP multiple quantum well active layer 5, and an n-type $(Al_{0.7}Ga_{0.3})_{0.5}In_{0.5}P$ cladding layer 6. The AlGaInP multiple quantum well active layer 5 comprises an $(Al_{0.5}Ga_{0.95})_{0.5}In_{0.5}P$ quantum well (whose thickness is 10 nm) and an $(Al_xGa_{1-x})_{5.0}In_{0.5}P$ barrier layer 5a. The aluminum composition (x) ranges from 0.3 to 0.7. Thin light guide layers each having a thickness ranging from 50 to 250 nm are disposed one on each side of the AlGaInP multiple quantum well active layer 5. The semiconductor laser shown in FIG. 4(A) has an oscillation wavelength of 640 nm, and a semiconductor waveguide whose effective refractive index ($n_{eff}$) is 3.30. The semiconductor laser has a front exit end coated with a coating film 1 of TiON having a refractive index of 2.50. The thickness of the coating film 1 is expressed by:

$$dx_1 = \frac{\lambda}{n_1} \times 0.23 = 59\,\text{nm}$$

resulting in a reflectivity $R_1=10\%$ and a COD index=5.6. A cross section of the semiconductor laser is shown in FIG. 4(B) which is taken along line IV(B)—IV(B) of FIG. 4(A). A GaAs block layer 10 serves to stabilize basic transverse mode oscillation. The GaAs block layer 10 may be replaced with either an $Al_{0.5}In_{0.5}P$ block layer or an $(Al_xGa_{1-x})_{0.5}In_{0.5}P$ block layer 11 shown in FIG. 4(C), where $(0.5 \leq x \leq 1.0)$.

Figure 6A:
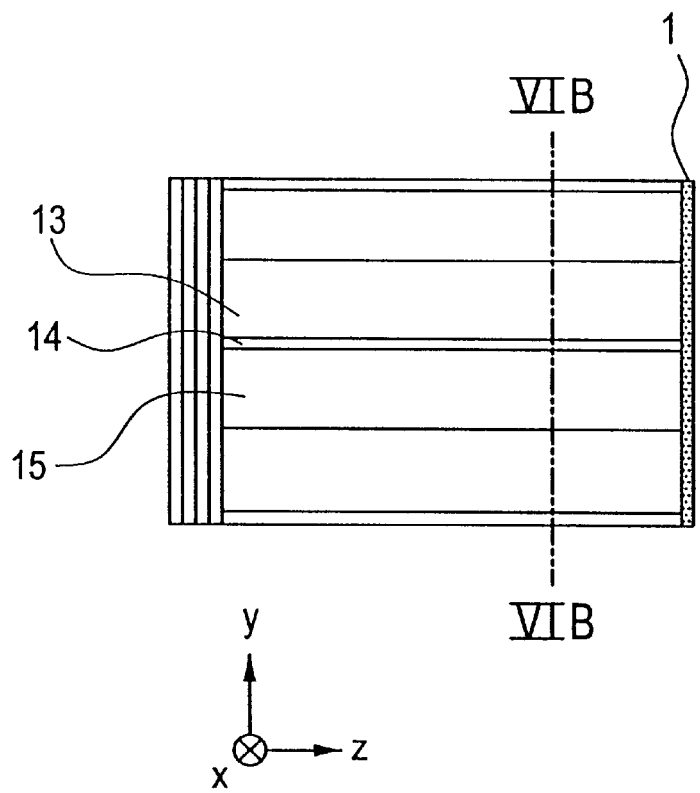
FIG. 6(A) is a cross-sectional view of an InGaAs/AlGaAs semiconductor laser according to yet still another embodiment of the present invention.
Figure 6B:
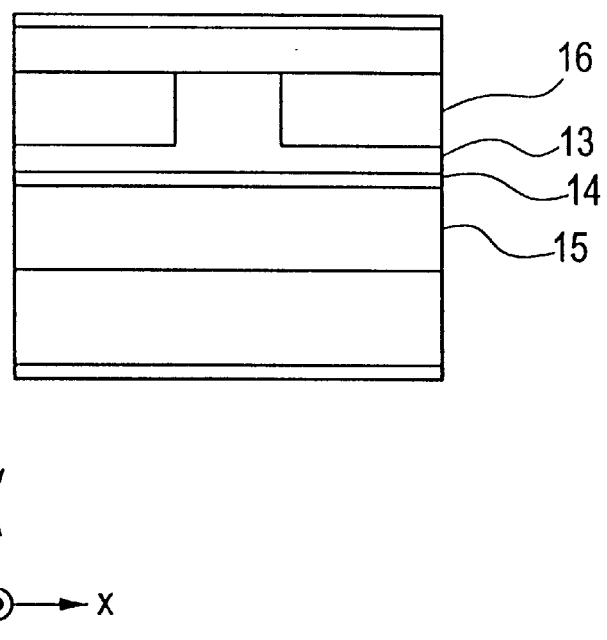
FIG. 6(B) is a cross-sectional view taken along line VI(B)—VI(B) of FIG. 6(A)

FIG. 6(A) shows in cross section an InGaAs/AlGaAs semiconductor laser according to yet still another embodiment of the present invention. The InGaAs/AlGaAs semiconductor laser has an oscillation wavelength of 0.98 μm. The semiconductor laser has a front exit end coated with a coating film 1 of TiON having a refractive index of 2.50 and a thickness of 90 nm, thus obtaining a reflectivity $R_1=10\%$ and a COD index=5.6. A cross section of the semiconductor laser is shown in FIG. 6(B) which is taken along line VI(B)—VI(B) of FIG. 6(A).

Figure 7:
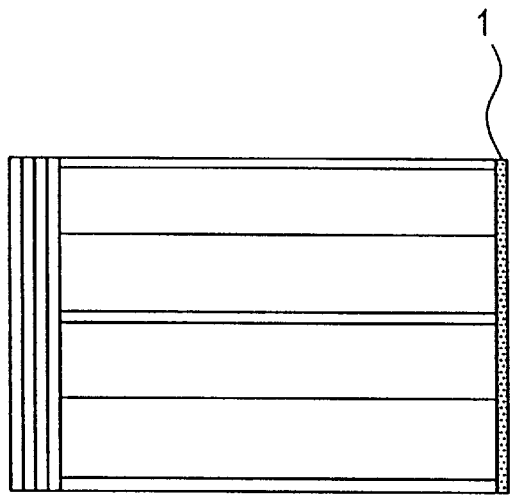
FIG. 7 is a cross-sectional view of an AlGaAs semiconductor laser according to a further embodiment of the present invention.
Figure 7:
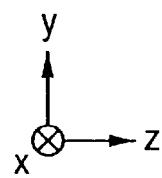

FIG. 7 shows in cross section an AlGaAs semiconductor laser according to a further embodiment of the present invention. The semiconductor laser has an oscillation wavelength of 0.83 μm. The semiconductor laser has a front exit end coated with a coating film 1 of TiON having a refractive index of 2.50 and a thickness of 76 nm, thus obtaining a reflectivity $R_1=10\%$ and a COD index=5.6.

Figure 8:
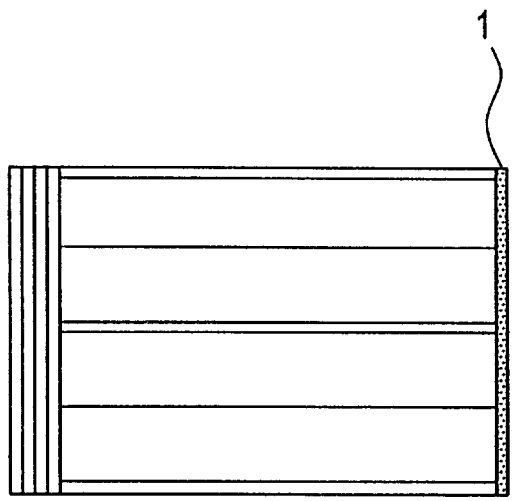
FIG. 8 is a cross-sectional view of an InGaAsP/InGaAlAs semiconductor laser according to a still further embodiment of the present invention.
Figure 8:
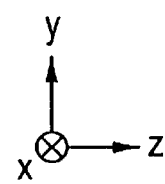

FIG. 8 shows in cross section an InGaAlAs semiconductor laser according to a still further embodiment of the present invention. The InGaAlAs semiconductor laser is of a structure reported by Anan, et al., in Electronics Letters, Vol. 33, No. 12, pages 1048–1049, 1997. The semiconductor laser has an oscillation wavelength of 1.3 μm. The semiconductor laser has a front exit end coated with a coating film 1 of TiON having a refractive index of 2.50 and a thickness of 120 nm. While no COD has been reported with respect to a conventional InGaAsP-based semiconductor laser whose oscillation wavelength ranges from 1.3 to 1.7 μm, it is highly possible for semiconductor lasers whose oscillation wavelength ranges from 1.3 to 1.7 μm to suffer COD. Damage to an input end as observed on an optical modulator of InGaAs/InAlAs having an oscillation wavelength of 1.55 μm (reported by Nakao, et al., in 58$^{th}$ Academic Lectures for Applied Physics Society, Oct. 2, 1997, Collected Preprints, No. 3, page 1121, Article No. 4p-ZB-9) is a phenomenon highly similar to COD, suggesting the possibility of COD to a semiconductor laser which is made of materials including aluminum and whose oscillation wavelength ranges from 1.3 to 1.7 μm. According to the present invention, COD to a semiconductor laser which is made of materials including aluminum and whose oscillation wavelength ranges from 1.3 to 1.7 μm can be suppressed.

The high-refractive-index material for use as an exit end coating film may be any of various materials such as AlON or the like, as well as TiON. Table given below shows coating film materials that can be used in the present invention and their refractive indexes. Other materials well known as optical materials, such as $CaF_2$, $CeO_2$ (Laser Handbook, republished 1975, page 191), or the like may also be used.

TABLE 1

Refractive indexes of various exit end passivation materials

| Names of materials | Refractive indexes Ordinary rays | Extra-ordinary rays | Transparent wavelength range | Literature |
|---|---|---|---|---|
| $TiO_2$ | 2.616 | 2.903 | | [1] |
| Amorphous $TiO_2$ | 2.25 | | | |
| $TiO_xN_{1-x}$ | 2.25–2.75 | | | |
| $Al_2O_3$ | 1.768 | 1.760 | | [1] |
| Amorphous $Al_2O_3$ | 1.68 | | | |
| $AlO_xN_{1-x}$ | 1.68–2.25 | | | |
| AlN | 2.25 | | >0.2 μm | [2] |
| AlP | 2.99 | | >0.51 μm | [2] |
| $AlA_s$ | 3.2 | | >0.58 μm | [2] |
| $SiO_2$ | 1.46 | | | |
| $SiO_xN_{1-x}$ | 1.46–1.96 | | | |
| C | 2.42 | | >0.23 μm | [2] |
| SiC | 2.5–2.7 | | >0.54 μm | [2] |
| BN | 2.2 | | >0.21 μm | [2] |
| BP | 3.0–3.5 | | >0.62 μm | [2] |
| GaN | 2.0 | | >0.37 μm | [2] |
| GaP | 5.19 | | >0.55 μm | [2] |
| GaAs | 3.655 | | >0.86 μm | [2] |
| ZnO | 2.0 | | >0.36 μm | [2] |
| ZnS | 2.26 | | >0.32 μm | [2] |
| ZnSe | 2.6–2.7 | | >0.46 μm | [2] |
| CdS | 2.30 | | >0.48 μm | [2] |
| CdSe | 2.55 | | >0.67 μm | [2] |
| Se | 2.78 | 3.58 | >0.60 μm | [2] |
| TlCl | 2.2–2.7 | | >0.39 μm | [2] |
| TlBr | 2.4–2.7 | | >0.48 μm | [2] |
| Thallium bromide iodide (KRS-5) | 2.395 | | >0.5 μm | [1], [2] |
| Thallium bromide iodide (KRS-6) | ~2.4 | | >0.4 μm | [2] |
| AgCl | 2.09 | | >0.37 μm | [1], [2] |
| AgBr | ~2.1 | | >0.46 μm | [2] |
| $TiO_2$ | 2.4–2.9 | | | [3] |
| $TiO_2$ | 2.5 | | | [4], [5] |
| $CeO_2$ | 2.30 | | | [3] |
| $ZrO_2$ | 2.10 | | | [3] |
| $Ta_2O_5$ | 2.6 | | | [4] |
| $Ta_2O_5:SiO_2$ | 1.5–2.2 | | | [6] |
| $TiO_2:SiO_2$ | 1.5–2.5 | | | |
| $Ta_2O_5:Al_2O_3$ | 1.6–2.6 | | | |
| $TiO_2:Al_2O_3$ | 1.6–2.6 | | | |
| $Cr_2O_3$ | 2.4 | | | [4] |
| $Gd_2O_3$ | 2.1 | | | [4] |
| ZnO | 2.0 | | | [4] |

Sources:
[1] Rika Nenpyou, 1994 edition (edited by National Astronomical Observatory and published November 30, 1993), The refractive indexes of various materials, pages 517–518.
[2] Optical property handbook (Asakura Shoten, published March 20, 1984), appendix A1.
[3] Modern optical science I, written by Motoichi Ohtsu (Asakura Shoten), page 93.
[4] V. R. Costich, CRC handbook of laser science and technology, ed. M. J. Weber (CRC Press. Inc., Boca Raton, Florida, 1987), Vol. V, Sec. 2.1, Table 2.1.4, page 414.
[5] Handbook of Optics, ed. M. Bass (McGraw-Hill, Inc., New York, 1995), Table 20, page 122.
[6] Ban Gone, et al., Collected Reprints for 45th Applied Physics Related Combined Lectures, No. 3, 28a-SG-5, page 1102, March 28, 1998.

If a semiconductor laser has an effective refractive index of 3.30 and a design refractive index of 0.10, then an optimum coating film refractive index is 2.52 according to the equation (22). If the oxygen composition of $TiO_xN_{1-x}$ is in the range of 30 to 50%, then an excellent coating film is produced. It is possible to control the refractive index by selecting conditions to form the film of $TiO_xN_{1-x}$. If the design refractive index of the semiconductor laser is 0.05, then the optimum coating film refractive index drops to 2.28. $TiO_xN_{1-x}$ where the oxygen composition is large and $AlO_xN_{1-x}$, $SiO_xN_{1-x}$ where the nitrogen composition is large are suitable for the coating film.

Some coating film materials including TiON are highly reactive and tends to react with water vapor in the air, varying the refractive index and the transmittance of the coating film. To avoid this drawback, the outer surface of the COD control coating film may be coated with a protective coating film for protection. The thickness of such a protective coating film is selected to be sufficiently large. The thickness of this protective coating film may be determined according to the equation:

$$\frac{\lambda}{2n_j}$$

With the protective coating film, the optical intensity distribution in the interface between the semiconductor and the coating film as shown in FIG. 3(A) is maintained for desired operation of the semiconductor laser.

If several coating film materials are directly coated on the semiconductor, then the deposited coating film may produce a strong distortion in the semiconductor, generating a crystal defect therein. To eliminate this shortcoming, a protective coating film for protecting the semiconductor may be interposed between the COD control coating film and the semiconductor. The thickness of such a protective coating film is selected to be sufficiently large. The thickness of this protective coating film may be determined according to the equation:

$$\frac{\lambda}{2n_j}$$

With the protective coating film, the optical intensity distribution in the interface between the semiconductor and the coating film as shown in FIG. 3(A) is maintained for desired operation of the semiconductor laser.

The semiconductor laser according to the present invention is capable of generating an optical output higher than the conventional limit level. The semiconductor laser according to the present invention can produce a high optical output even with an exit end coating film having an exit end reflectivity higher than the conventional exit end reflectivity. Consequently, the present invention provides a high-output semiconductor laser which is highly stable and reliable while keeping good oscillation characteristics such as a threshold current and temperature characteristics.

While preferred embodiments of the present invention have been described using specific terms, such description is for illustrative purposes only, and it is to be understood that changes and variations may be made without departing from the sprit or scope of the following claims.

What is claimed is:

1. A semiconductor laser having a coating film composed of a single layer or a plurality of layers, on an exit end of a semiconductor laser waveguide, said coating film having at least one layer having a refractive index $n_1$ which falls within a range of ±20% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end.

2. A semiconductor laser having a coating film composed of a single layer or a plurality of layers, on an exit end of a semiconductor laser waveguide, said coating film having at least one layer having a refractive index $n_1$ which falls within a range of ±10% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflective of said exit end.

3. A semiconductor laser having a coating film composed of a single layer or a plurality of layers, on an exit end of a semiconductor laser waveguide, said coating film having at least one layer having a refractive index $n_1$ which falls within a range of ±20% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end, said coating film having a layer other than said layer having the refractive index $n_1$, the other layer having a thickness according to:

$$\frac{\lambda}{2n_j}$$

where $n_j$ represents the refractive index of the other layer and $\lambda$ the oscillation wavelength of the semiconductor laser.

4. A semiconductor laser having a coating film composed of a single layer or a plurality of layers, on an exit end of a semiconductor laser waveguide, said coating film having at least one layer having a refractive index $n_1$ which falls within a range of ±10% of:

$$n_1 = \sqrt{n_{\mathit{eff}} \times \frac{1-R_1}{\left(1-\sqrt{R_1}\right)^2}}$$

where $n_{\mathit{eff}}$ represents the effective refractive index of said semiconductor laser waveguide and $R_1$ the reflectivity of said exit end, said coating film having a layer other than said layer having the refractive index $n_1$, the other layer having a thickness according to:

$$\frac{\lambda}{2n_j}$$

where $n_j$ represents the refractive index of the other layer and $\lambda$ the oscillation wavelength of the semiconductor laser.

* * * * *

UNITED STATES PATENT AND TRADEMARK OFFICE
CERTIFICATE OF CORRECTION

PATENT NO.   : 6,285,700 B1
DATED        : September 4, 2001
INVENTOR(S)  : Yoshiyasu Ueno et al.

It is certified that error appears in the above-identified patent and that said Letters Patent is hereby corrected as shown below:

<u>Column 7,</u>
Lines 28 and 29, (equation 21), after " $E_1^L \dfrac{n_{\mathit{eff}} - n_1^2}{n_1^2 + n_{\mathit{eff}}}$ " insert -- $x \, E_1^R$ --

Figure 5:
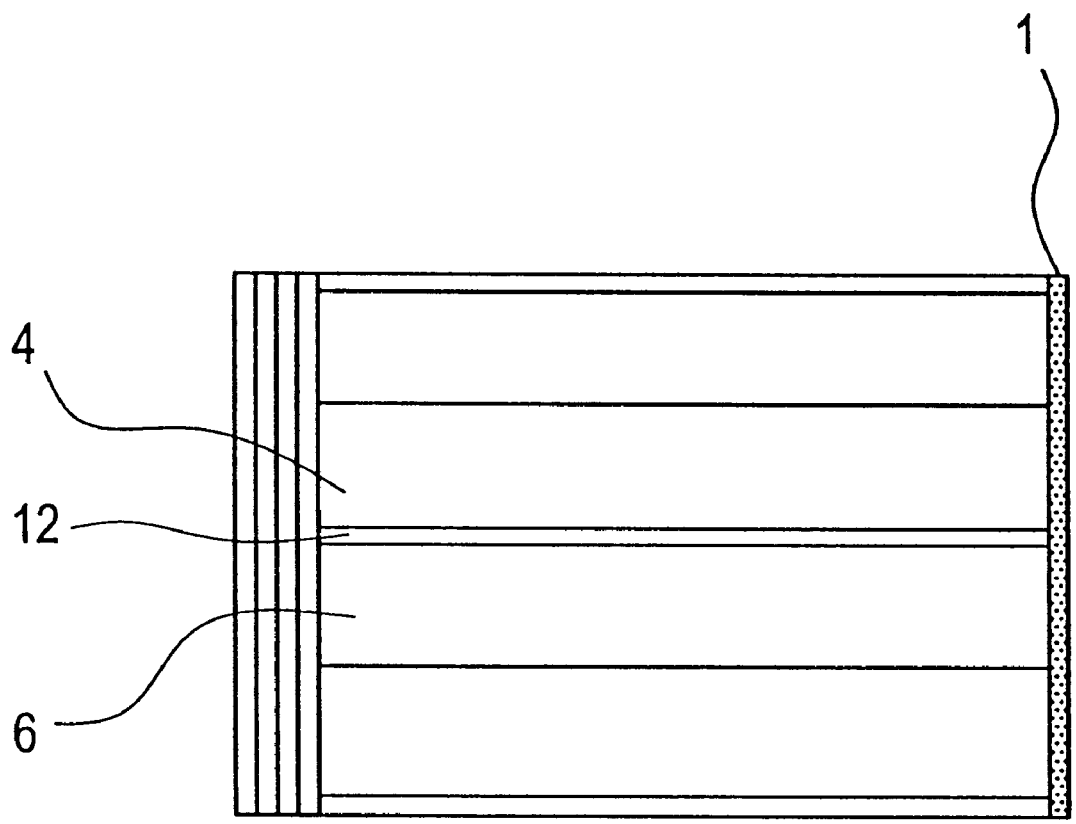
FIG. 5 is a cross-sectional view of an AlGaInP bulk active layer laser according to still another embodiment of the present invention.
Figure 5:
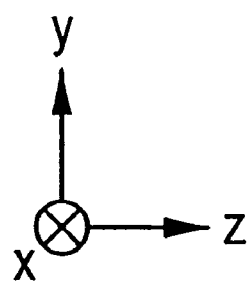

<u>Column 11,</u>
Line 13, after "(0.5≤x≤1.0)." insert -- The AlGaInp multiple quantum well active layer 5 may be replaced with an AlGaInp bulk active layer 12 shown in Fig. 5 --.

Signed and Sealed this

Sixteenth Day of December, 2003

JAMES E. ROGAN
*Director of the United States Patent and Trademark Office*